(12) United States Patent
Tai

(10) Patent No.: US 7,525,378 B2
(45) Date of Patent: Apr. 28, 2009

(54) CIRCUIT FOR REDUCING CROSSTALK

(75) Inventor: Jy-Der David Tai, Phoenix, AZ (US)

(73) Assignee: Tai-1 Microelectronics Corp., Taipei Hsien (TW)

( * ) Notice: Subject to any disclaimer, the term of this patent is extended or adjusted under 35 U.S.C. 154(b) by 210 days.

(21) Appl. No.: 11/562,992

(22) Filed: Nov. 23, 2006

(65) Prior Publication Data

US 2008/0122533 A1    May 29, 2008

(51) Int. Cl.
  *H03F 21/00*    (2006.01)
(52) U.S. Cl. .................................. 330/207 A; 330/251
(58) Field of Classification Search .................. 330/10, 330/207 A, 251
  See application file for complete search history.

(56) References Cited

U.S. PATENT DOCUMENTS 4,949,048 A * 8/1990 Tokumo et al. ............. 330/251
7,339,425 B2 * 3/2008 Yang .......................... 330/251
2008/0042743 A1 * 2/2008 Wong et al. ................... 330/10

\* cited by examiner

*Primary Examiner*—Khanh V Nguyen
(74) *Attorney, Agent, or Firm*—Leong C. Lei

(57) ABSTRACT

The circuit contains an input signal unit, an amplifier unit, and a comparator unit, cascaded in the foregoing order. The circuit further contains a ramp generator unit providing a ramp signal to the comparator unit. In one embodiment of the present invention, at least one of the two links between the input signal unit and the amplifier unit is connected to a voltage unit. By providing an appropriate voltage through the voltage unit, the signals fed into the amplifier unit have different DC bias voltages. As such, the ramp signal crosses these signals at different points of time respectively, and the zero-crossing times of the first and second Class-D signals output by the comparator unit are thereby separated so as to achieve low switching noise and electromagnetic interference.

8 Claims, 11 Drawing Sheets

CIRCUIT FOR REDUCING CROSSTALK

(A) TECHNICAL FIELD OF THE INVENTION

The present invention generally relates to circuits for reducing crosstalk, and more particularly to a circuit providing different DC bias voltages to the input signals so as to separate the zero-crossing points of the output Class-D signals.

(B) DESCRIPTION OF THE PRIOR ART

U.S. Pat. No. 6,262,632 teaches a Class-D amplifier circuit. In an embodiment shown in the reference drawing FIG. 7 of the 632 patent, two ramp signals are produced by two separate circuits inside a ramp generator and therefore the two ramp signals cannot be exactly identical. As such, distortions may arise from the pulse-width modulated signals produced by the circuit.

As shown in FIG. 9 of the 632 patent, the circuit uses a phase lock loop (PLL) circuit to introduce a time delay into any one of the two ramp signals produced by the ramp generator so as to reduce crosstalk. However, the high cost of the PLL circuit is an issue.

Again, as shown in FIG. 10 of the 632 patent, the circuit uses a PLL circuit and two asymmetric comparators so that the output from the comparators have different zero-crossing points and thereby crosstalk is reduced. Similarly, the high cost of the PLL circuit remains an issue.

SUMMARY OF THE INVENTION

Accordingly, a circuit for reducing crosstalk is provided herein. The circuit contains an input signal unit, an amplifier unit, and a comparator unit, cascaded in the foregoing order. The circuit further contains a ramp generator unit providing a ramp signal to the comparator unit.

In one embodiment of the present invention, at least one of the two links between the input signal unit and the amplifier unit is connected to a voltage unit. By providing an appropriate voltage through the voltage unit, the signals fed into the amplifier unit have different DC bias voltages. As such, the ramp signal crosses these signals at different point of time respectively, and the zero-crossing times of the first and second Class-D signals output by the comparator unit are thereby separated so as to achieve low switching noise and electromagnetic interference.

In another embodiment of the present invention, at least one of the two outputs from the comparator unit is connected to a delay member. By providing appropriate time delay through the delay member, the output Class-D signals have different and separated zero-crossing times so as to achieve low switching noise and electromagnetic interference.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those verses in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
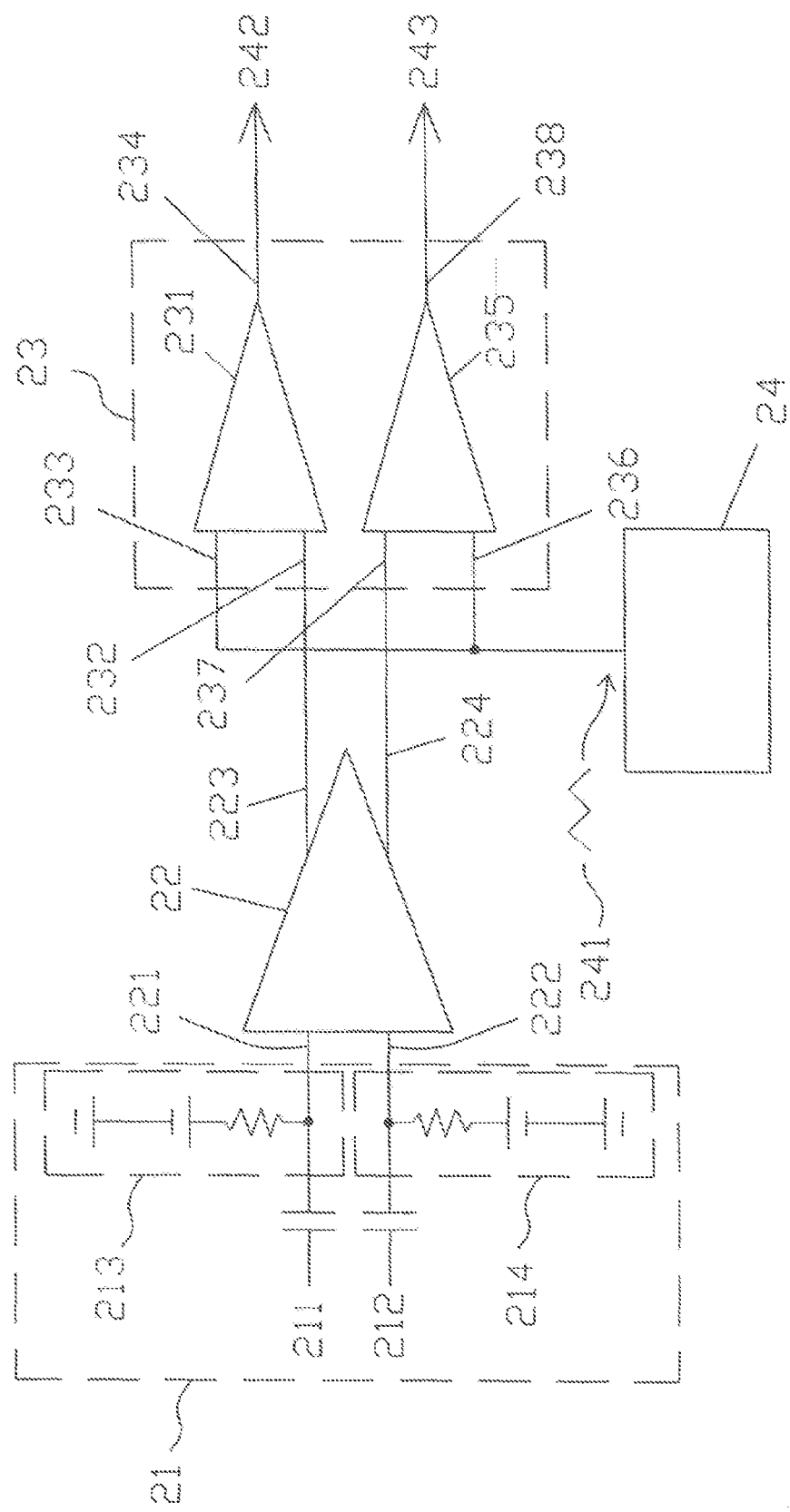
FIG. 1 is a schematic diagram showing a circuit according to a first embodiment of the present invention.

FIG. 1 is a schematic diagram showing a circuit according to a first embodiment of the present invention. As illustrated, the circuit contains an input signal unit 21, an amplifier unit 22, a ramp generator unit 24, and a comparator unit 23.

The input signal unit 21 has a first input terminal 211 and a second input terminal 212, which are connected to a first input terminal 221 and a second input terminal 222 of the amplifier unit 22, respectively. The input signal unit 21 contains a first voltage unit 213 and a second voltage unit 214, which are connected to the link between the first input terminals 211 and 221 and to the link between the second input terminals 212 and 22 of the input signal unit 21 and the amplifier unit 22, respectively. By providing different voltages through the first and second voltage units 213 and 214, the signals fed into the amplifier unit 22 via the first and second input terminals 221 and 222 are raised or lowered to have different DC bias voltages.

The amplifier unit 22 provides amplification to the signals received from its first and second input terminals 221 and 222, and outputs the amplified signals to a first output terminal 223 and a second output terminal 224, respectively. The first and second output terminals 223 and 224 in turn are connected to the comparator unit 23.

The ramp generator unit 24 provides a ramp signal 241 also to the comparator unit 23.

The comparator unit 23 contains a first comparator 231 and a second comparator 235. The first comparator 231 has a signal input terminal 232 connected to the first output terminal 223 of the amplifier unit 22, and a ramp input terminal 233 connected to the ramp generator unit 24 for receiving the ramp signal 241. The first comparator 231 compares the signals on the two input terminals 232 and 233, and produces a first Class-D signal 242 on a signal output terminal 234. Similarly, The second comparator 235 has a signal input terminal 237 connected to the second output terminal 224 of the amplifier unit 22, and a ramp input terminal 236 connected to the ramp generator unit 24 for receiving the ramp signal 241. The second comparator 235 compares the signals on the two input terminals 237 and 236, and produces a second Class-D signal 243 on a signal output terminal 238.

Figure 2:
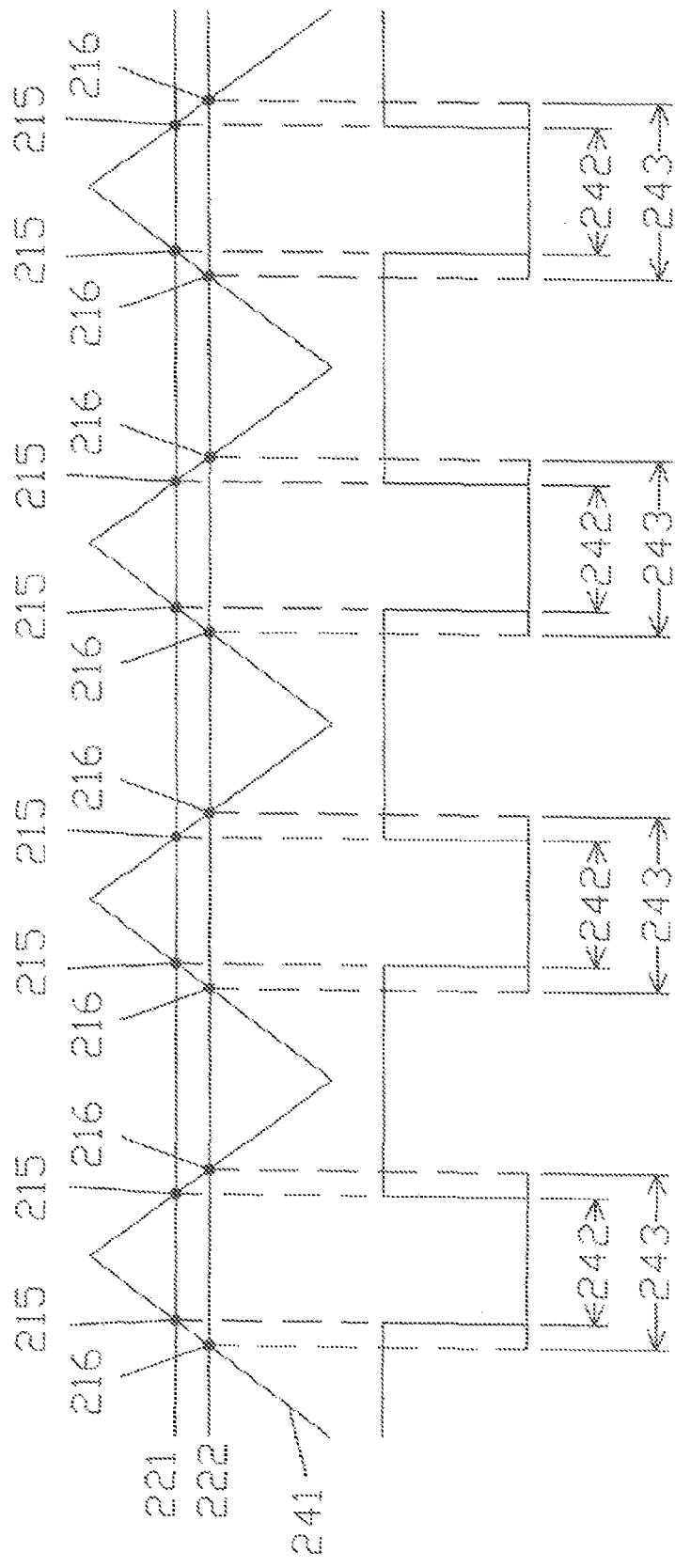
FIG. 2 is a timing diagram showing the waveforms of relevant signals of the circuit of FIG. 1.

FIG. 2 is a timing diagram showing the waveforms of relevant signals of the circuit of FIG. 1. As illustrated, the signals of the first and second input terminals 221 and 222 of the amplifier unit 22 are raised or lowered to different levels by the voltage units 213 and 214, respectively. These signals are then amplified by the amplifier unit 22 and compared with the ramp signal 241 by the comparators 231 and 235, respectively. As shown, the ramp signal 241 crosses these signals at different points of time 215 and 216, respectively, and the first and second Class-D signal 242 and 243 therefore have different pulse widths. The zero-crossing times of the first and second Class-D signals 242 and 243 are thereby separated so as to achieve low switching noise and electromagnetic interference. As all components are quite common, the circuit has a very low cost.

Figure 3:
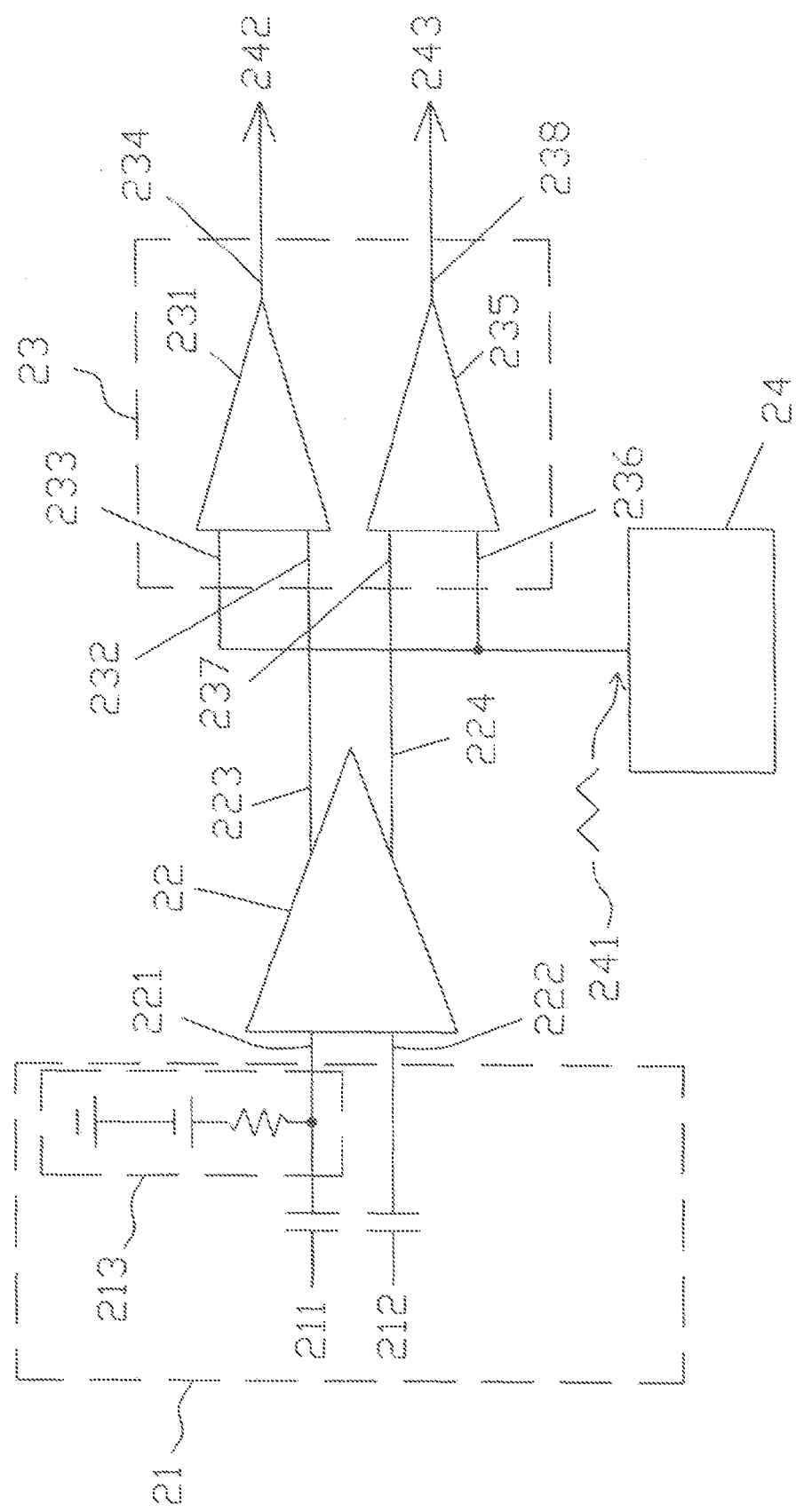
FIG. 3 is a schematic diagram showing a circuit according to a second embodiment of the present invention.

FIG. 3 is a schematic diagram showing a circuit according to a second embodiment of the present invention. By comparing FIGS. 1 and 3, it can be seen that the two embodiments are identical except that the second voltage unit 214 of the first embodiment is omitted in the present embodiment. Based on the same principle, by providing an appropriate DC bias voltage through the first voltage unit 213, the signal fed into the amplifier unit 22 via the first input terminal 221 would have a different (higher in this embodiment) level from that of the signal fed through the second input terminal 222. As such, the waveforms of the relevant signals of the present embodiment should be like what is shown in FIG. 2. Accordingly, the zero-crossing times of the first and second Class-D signals 242 and 243 are thereby separated to achieve low switching noise and electromagnetic interference. As all components are quite common, the circuit has a very low cost.

Figure 4:
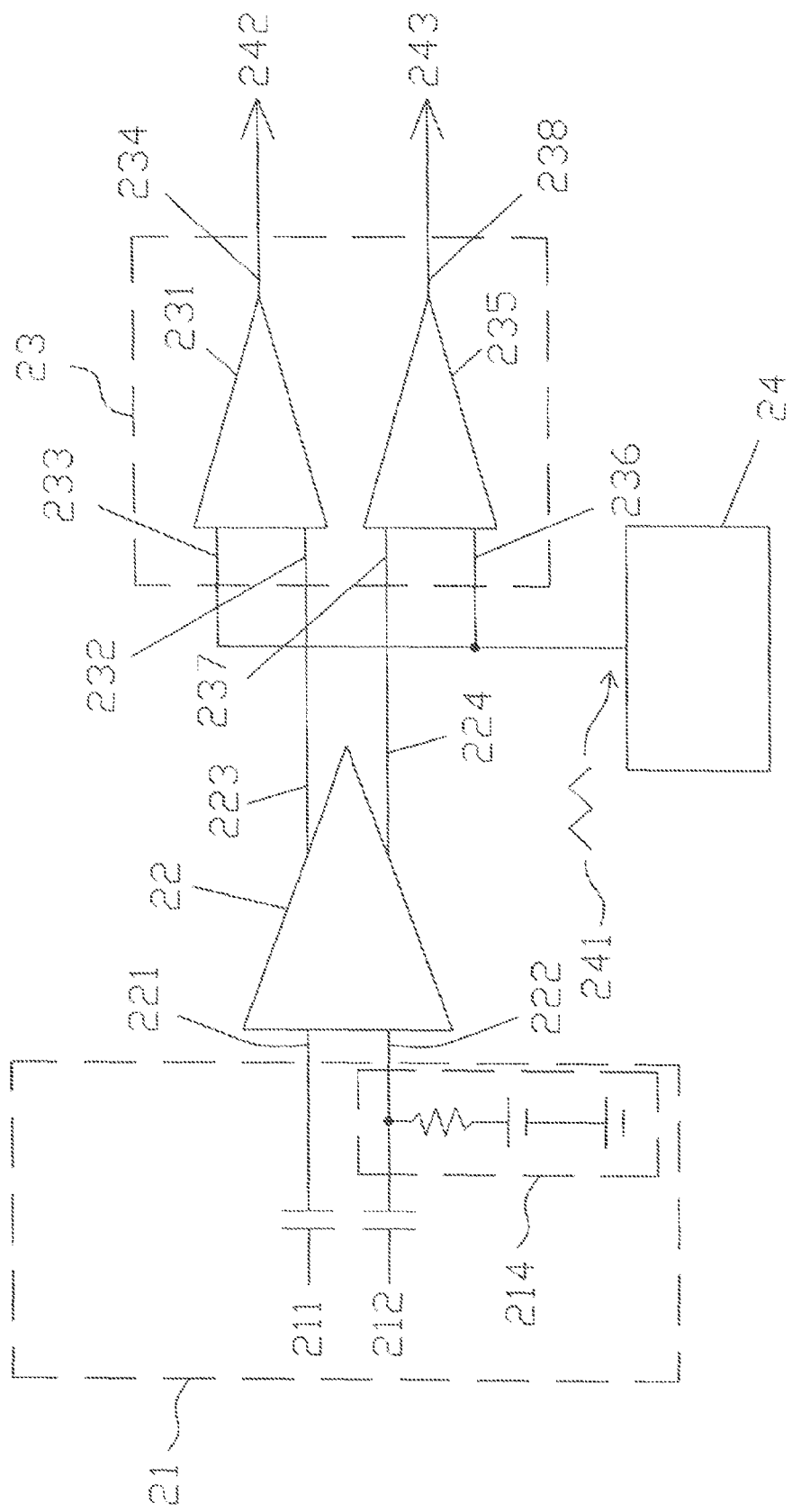
FIG. 4 is a schematic diagram showing a circuit according to a third embodiment of the present invention.
Figure 5:
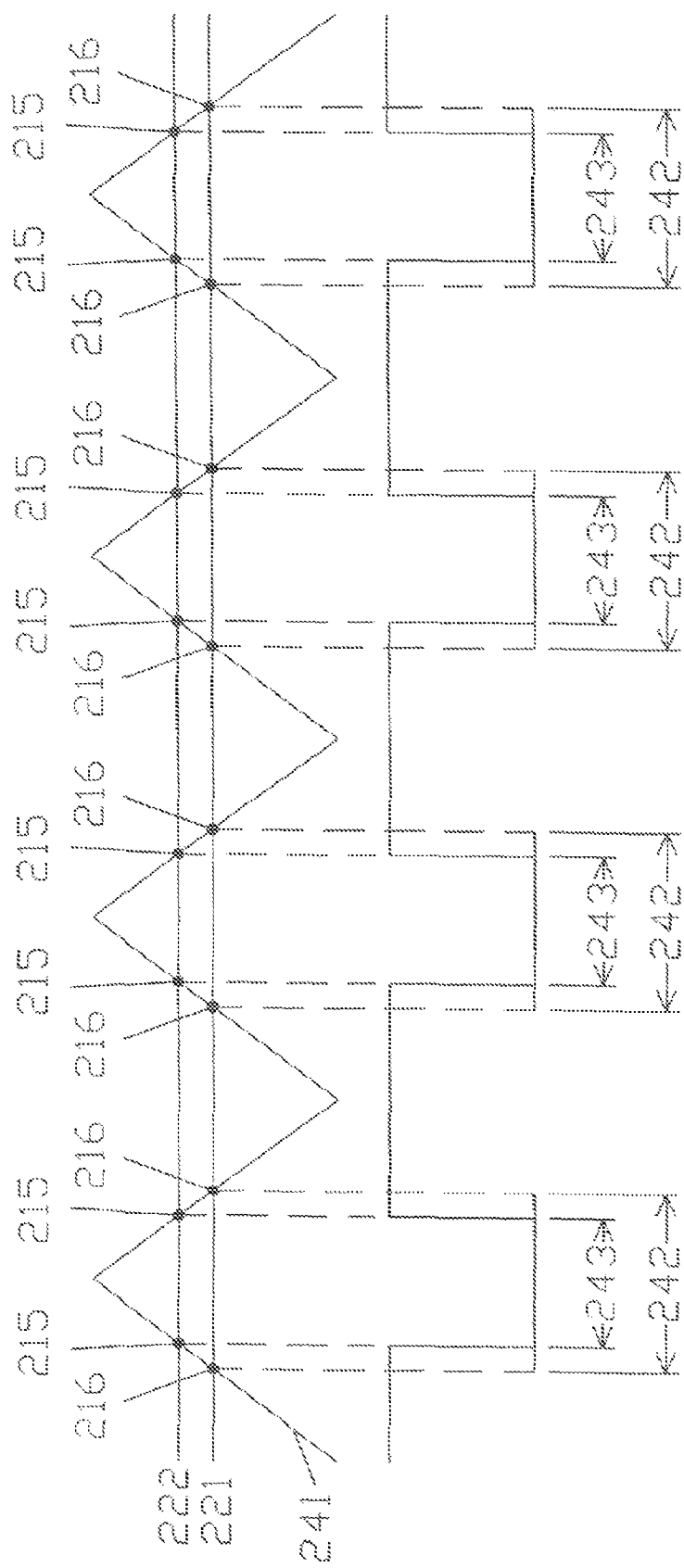
FIG. 5 is a timing diagram showing the waveforms of relevant signals of the circuit of FIG. 4.

FIG. 4 is a schematic diagram showing a circuit according to a third embodiment of the present invention. By comparing FIGS. 1 and 4, it can be seen that the two embodiments are identical except that the first voltage unit 213 of the first embodiment is omitted in the present embodiment. Based on the same principle, by providing an appropriate DC bias voltage through the second voltage unit 214, the signal fed into the amplifier unit 22 via the second input terminals 222 would have a different (higher in this embodiment) level from that of the signal fed through the first input terminal 221. As such, the waveforms of the relevant signals of the present embodiment should be like what is shown in FIG. 5. Accordingly, the zero-crossing times of the first and second Class-D signals 242 and 243 are thereby separated to achieve low switching noise and electromagnetic interference. As all components are quite common, the circuit has a very low cost.

Figure 6:
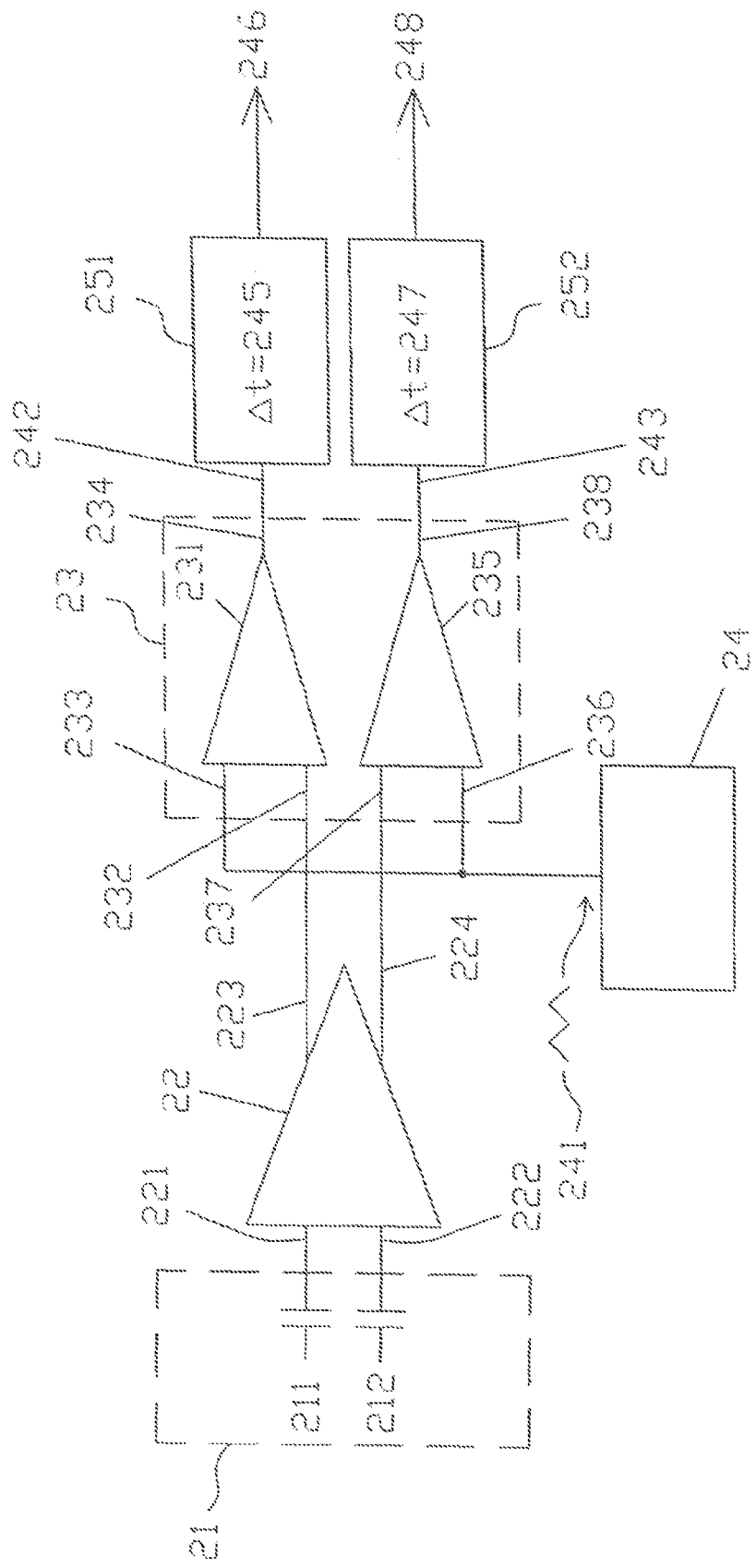
FIG. 6 is a schematic diagram showing a circuit according to a fourth embodiment of the present invention.

FIG. 6 is a schematic diagram showing a circuit according to a fourth embodiment of the present invention. As illustrated, the circuit contains an input signal unit 21, an amplifier unit 22, a ramp generator 24, a comparator unit 23, and a delay unit.

Similar to the previous embodiments, the input signal unit 21 has a first input terminal 211 and a second input terminal 212, which are connected to a first input terminal 221 and a second input terminal 222 of the amplifier unit 22, respectively. However, the input signal unit 21 of the present embodiment does not contain any voltage unit.

The amplifier unit 22 provides amplification to the signals received from its first and second input terminals 221 and 222, and outputs the amplified signals to a first output terminal 223 and a second output terminal 224, respectively. The first and second output terminals 223 and 224 in turn are connected to the comparator unit 23.

The ramp generator unit 24 provides a ramp signal 241 also to the comparator unit 23.

The comparator unit 23 contains a first comparator 231 and a second comparator 235. The first comparator 231 has a signal input terminal 232 connected to the first output terminal 223 of the amplifier unit 22, and a ramp input terminal 233 connected to the ramp generator unit 24 for receiving the ramp signal 241. The first comparator 231 compares the signals on the two input terminals 232 and 233, and produces a first Class-D signal 242 on a signal output terminal 234. Similarly, The second comparator 235 has a signal input terminal 237 connected to the second output terminal 224 of the amplifier unit 22, and a ramp input terminal 236 connected to the ramp generator unit 24 for receiving the ramp signal 241. The second comparator 235 compares the signals on the two input terminals 237 and 236, and produces a second Class-D signal 243 on a signal output terminal 238.

The delay unit contains a first delay member 251 and a second delay member 252. The signal output terminals 234 and 238 are connected to the first and second delay member 251 and 252, respectively, which introduce different periods of time delay to the first and second Class-D signals 242 and 243.

Figure 7:
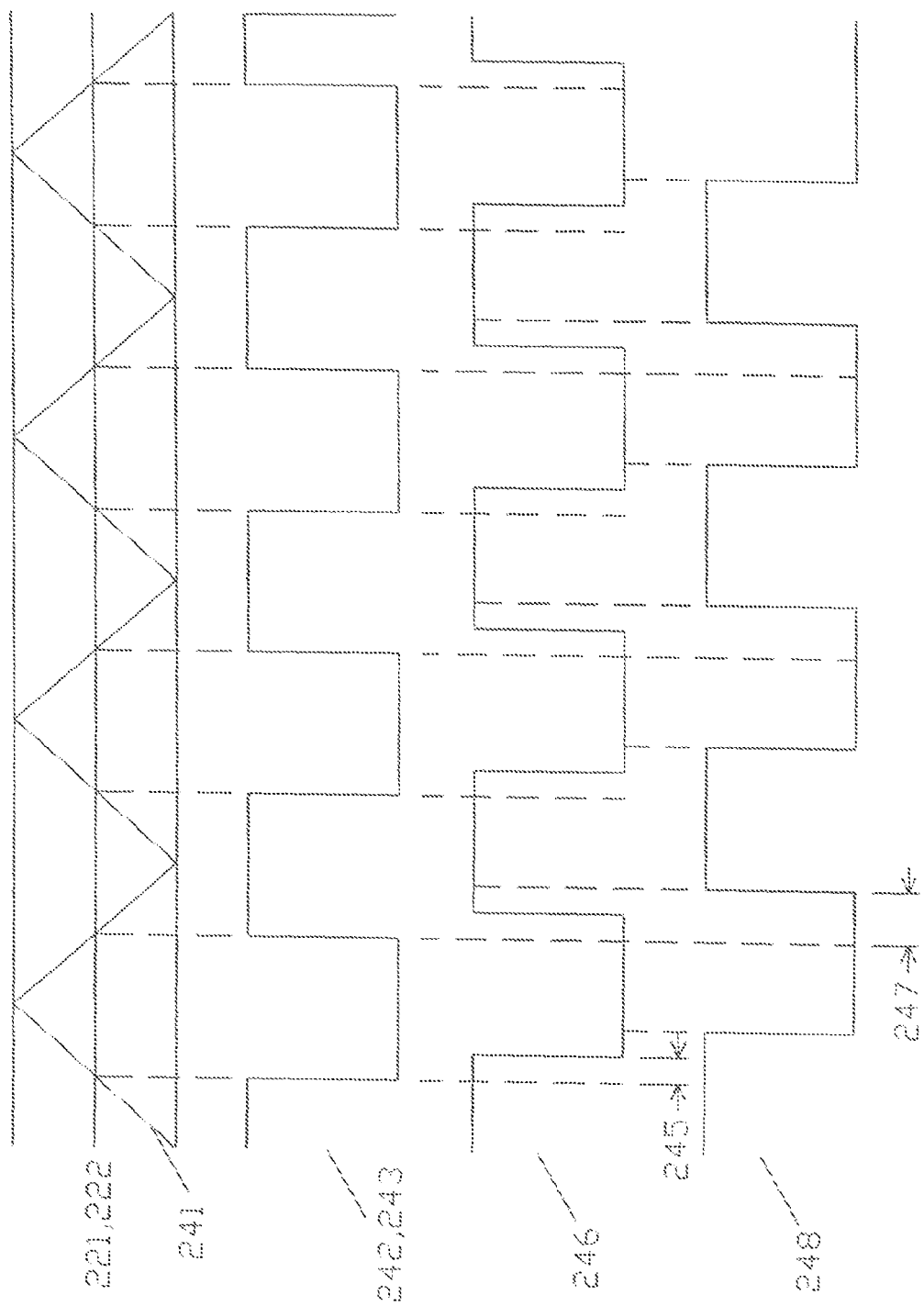
FIG. 7 is a timing diagram showing the waveforms of relevant signals of the circuit of FIG. 6.

FIG. 7 is a timing diagram showing the waveforms of relevant signals of the circuit of FIG. 6. As illustrated, the signals of the first and second input terminals 221 and 222 of the amplifier unit 22 are amplified identically by the amplifier unit 22 and compared with the ramp signal 241 by the comparators 231 and 235, respectively. As shown, the ramp signal 241 crosses these signals at same points of time, and the first and second Class-D signal 242 and 243 therefore have identical pulse widths. Then, as the first delay member 251 introduces a shorter delay 245 while the second delay member 252 introduces a longer delay 247, the delay members 251 and 252 produce delayed signals 246 and 248 having different and separated zero-crossing times so as to achieve low switching noise and electromagnetic interference. As all components are quite common, the circuit has a very low cost.

Figure 8:
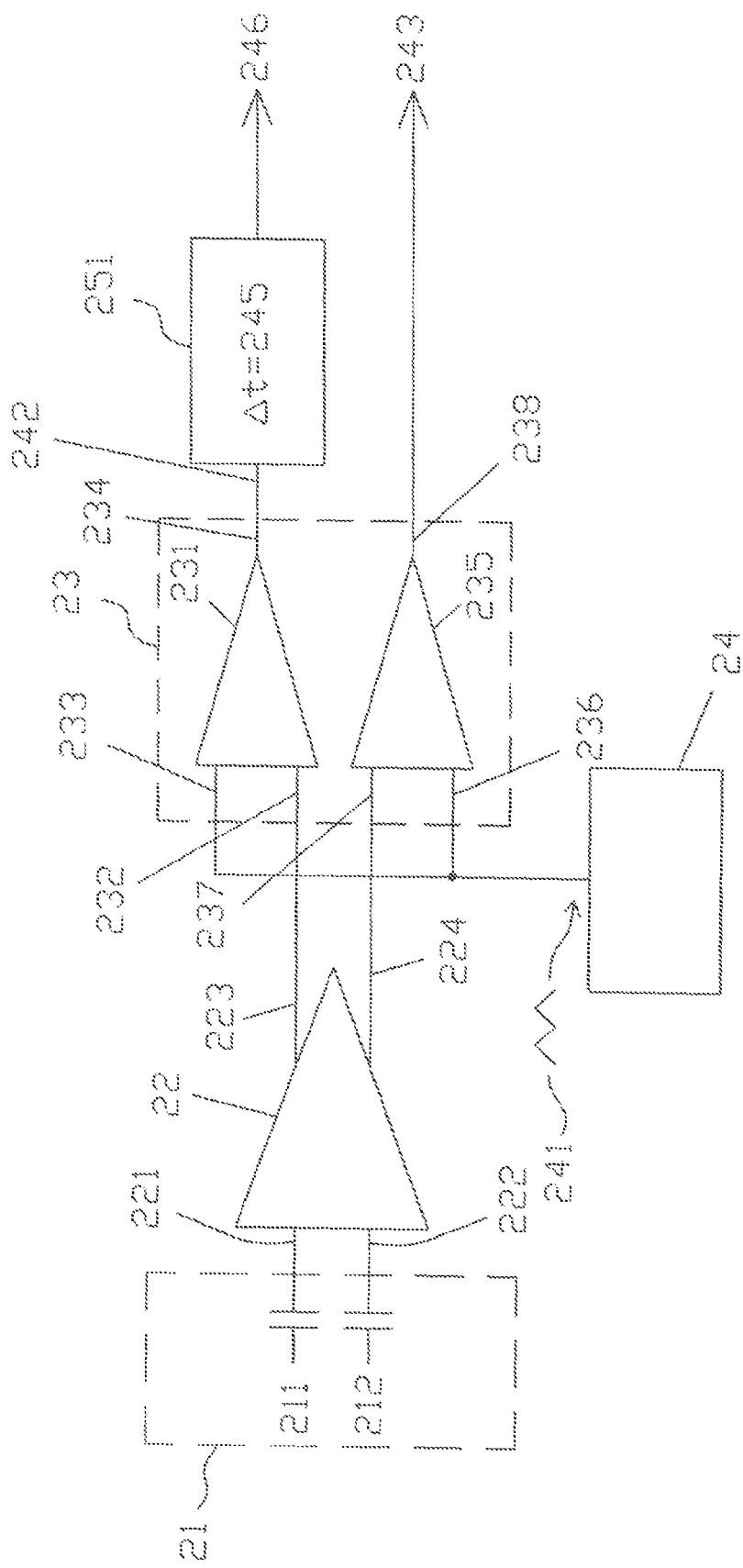
FIG. 8 is a schematic diagram showing a circuit according to a fifth embodiment of the present invention.
Figure 9:
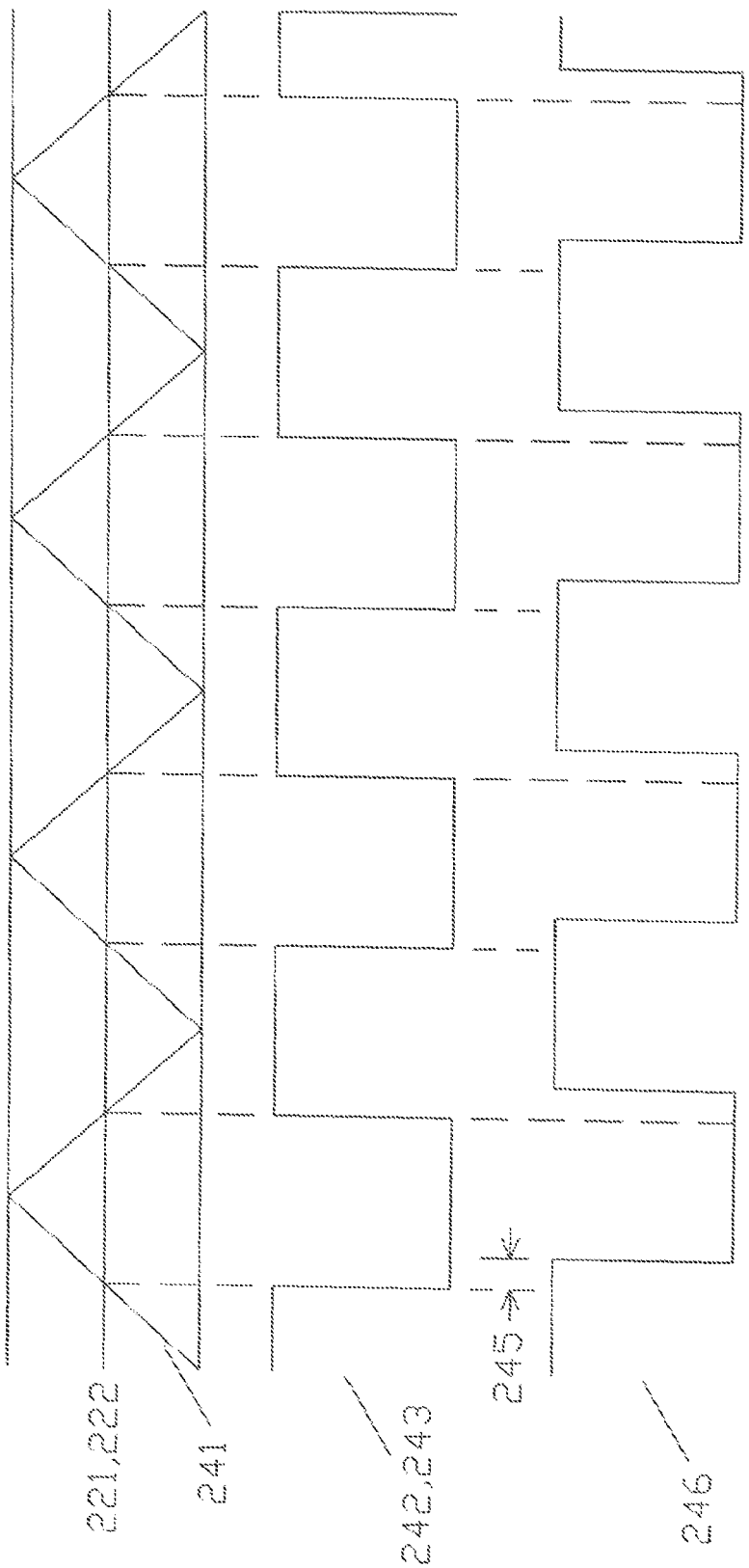
FIG. 9 is a timing diagram showing the waveform of relevant signals of the circuit of FIG. 8.

FIG. 8 is a schematic diagram showing a circuit according to a fifth embodiment of the present invention. By comparing FIGS. 8 and 6, it can be seen that the two embodiments are identical except that the second delay member 252 of the fourth embodiment is omitted in the present embodiment. Based on the same principle, by providing an appropriate delay 245 through the first delay member 251, the delay signal 246 produced by the first delay member 251 would have a different (later in this embodiment) zero-crossing time from the second Class-D signal 243. As such, the waveforms of the relevant signals of the present embodiment should be like what is shown in FIG. 9. As the zero-crossing times of the output second Class-D signal 243 and the output delayed signal 246 are separated, low switching noise and electromagnetic interference are achieved. As all components are quite common, the circuit has a very low cost.

Figure 10:
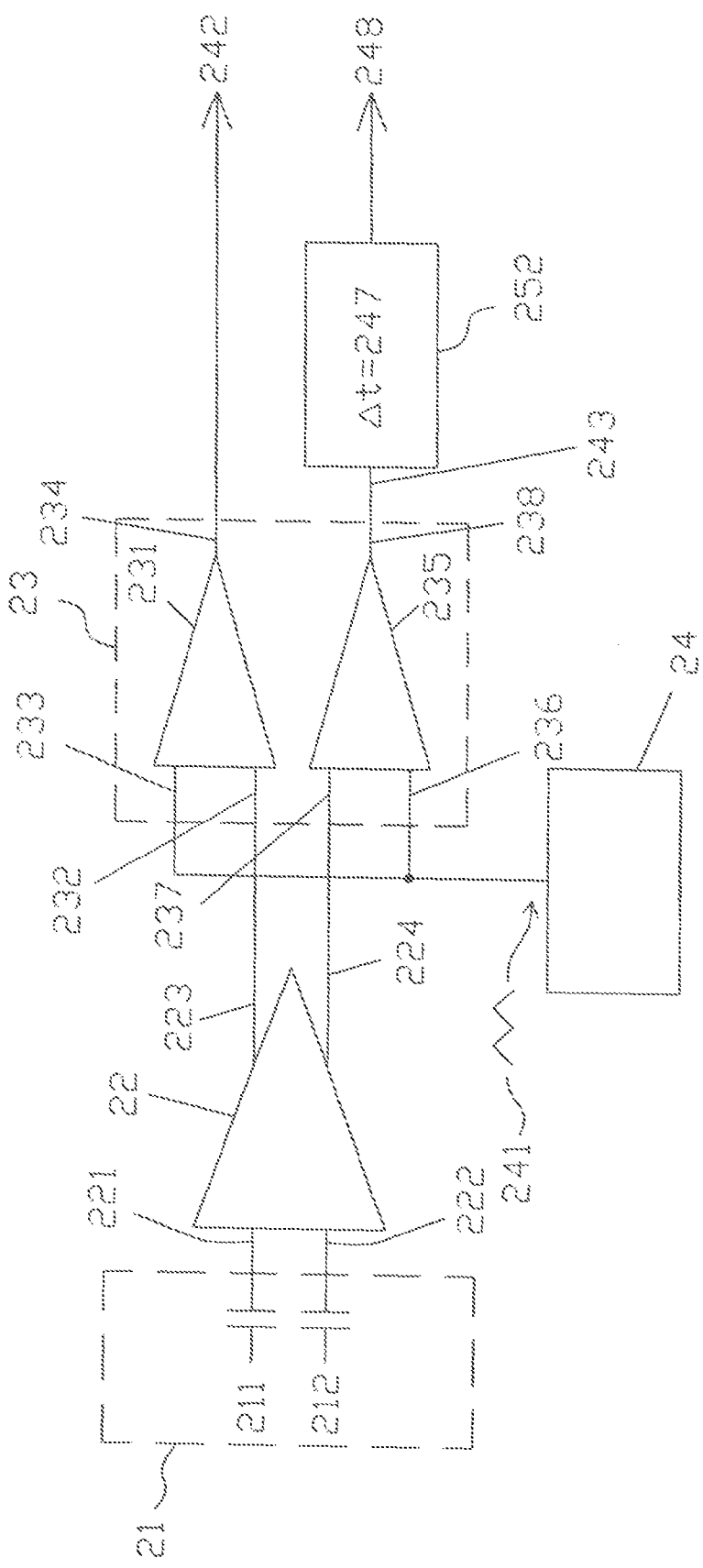
FIG. 10 is a schematic diagram showing a circuit according to a sixth embodiment of the present invention.
Figure 11:
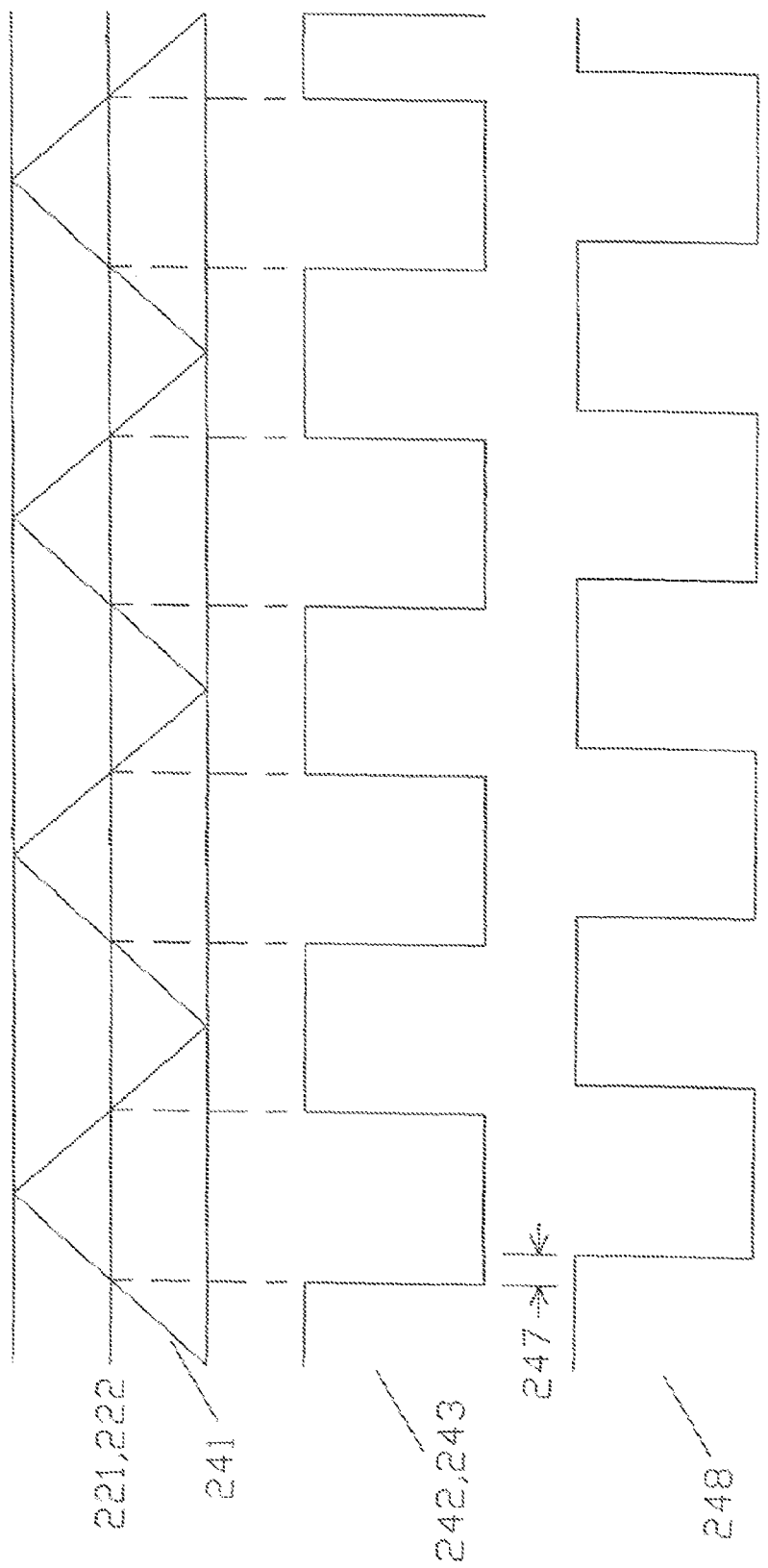
FIG. 11 is a timing diagram showing the waveforms of relevant signals of the circuit of FIG. 10.

FIG. 10 is a schematic diagram showing a circuit according to a sixth embodiment of the present invention. By comparing FIGS. 10 and 6, it can be seen that the two embodiments are identical except that the first delay member 251 of the fourth embodiment is omitted in the present embodiment. Based on the same principle, by providing an appropriate delay 247 through the second delay member 252, the delay signal 248 produced by the second delay member 252 would have a different (later in this embodiment) zero-crossing time from the first Class-D signal 242. As such, the waveforms of the relevant signals of the present embodiment should be like what is shown in FIG. 11. As the zero-crossing times of the output first Class-D signal 242 and the output delayed signal 248 are separated, low switching noise and electromagnetic interference are achieved. As all components are quite common, the circuit has a very low cost.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A circuit for reducing crosstalk comprising:
   an input signal unit having a first input terminal and a second input terminal;
   an amplifier unit having a first input terminal, a second input terminal, a first output terminal, and a second output terminal, said first and second input terminals of said input signal unit connected to said first and second input terminals of said amplifier unit, respectively, said amplifier unit providing amplification to the signals received from said first and second input terminals of said amplifier unit and providing amplified output signals on said first and second output terminals, respectively;
   a ramp generator unit providing a ramp signal; and
   a comparator unit having a first comparator and a second comparator, each of said first and second comparators having a signal input terminal, a ramp input terminal, and a signal output terminal, said signal input terminals of said first and second comparators connected to said first and second output terminals of said amplifier unit, respectively, said ramp input terminals of said first and second comparators receiving said ramp signal from said ramp generator unit, said first and second comparators comparing the signals on said signal input terminals and on said ramp input terminals and producing a first Class-D signal and a second Class-D signal on said signal output terminals, respectively;
   wherein the signals output by said input signal unit and fed to said amplifier unit are controlled by said input signal unit to have different DC bias voltages so that said ramp signal crosses the signals output by said amplifier unit at different times and thereby said first and second Class-D signals output by said first and second comparators have different and separated zero-crossing times.

2. The circuit according to claim 1, wherein said input signal unit further having a first voltage unit connected to a node between said first input terminals of said input signal unit and said amplifier unit; and, by having said first voltage unit providing an appropriate voltage, the signals output by said input signal unit and fed to said amplifier unit have different DC bias voltages.

3. The circuit according to claim 2, wherein said input signal unit further having a second voltage unit connected to a node between said second input terminals of said input signal unit and said amplifier unit; and, by having said second voltage unit providing an appropriate voltage, the signals output by said input signal unit and fed to said amplifier unit have different DC bias voltages.

4. The circuit according to claim 1, wherein said input signal unit further having a first voltage unit and a second voltage unit connected to nodes between said first input terminals and between said second input terminals of said input signal unit and said amplifier unit, respectively; and, by having said first and second voltage units providing appropriate voltages, the signals output by said input signal unit and fed to said amplifier unit have different DC bias voltages.

5. A circuit for reducing crosstalk comprising:
   an input signal unit having a first input terminal and a second input terminal;
   an amplifier unit having a first input terminal, a second input terminal, a first output terminal, and a second output terminal, said first and second input terminals of said input signal unit connected to said first and second input terminals of said amplifier unit, respectively, said amplifier unit providing amplification to the signals received from said first and second input terminals of said amplifier unit and providing amplified output signals on said first and second output terminals, respectively;
   a ramp generator unit providing a ramp signal;
   a comparator unit having a first comparator and a second comparator, each of said first and second comparators having a signal input terminal, a ramp input terminal, and a signal output terminal, said signal input terminals of said first and second comparators connected to said first and second output terminals of said amplifier unit, respectively, said ramp input terminals of said first and second comparators receiving said ramp signal from said ramp generator unit, said first and second comparators comparing the signals on said signal input terminals and on said ramp input terminals and producing a first Class-D signal and a second Class-D signal on said signal output terminals, respectively; and
   a delay unit connected to said signal output terminals of said first and second comparators, at least one of said first and second Class-D signals output by said first and second comparators is delayed by said delay unit so that said first and second Class-D signals have different and separated zero-crossing times.

6. The circuit according to claim 5, wherein said delay unit has a first delay member connected to said signal output terminal of said first comparator so that said first Class-D signal is delayed for a first period of time while said second Class-D signal is directly output by said delay unit.

7. The circuit according to claim 6, wherein said delay unit has a second delay member connected to said signal output terminal of said second comparator so that said second Class-D signal is delayed for a second period of time while said first Class-D signal is directly output by said delay unit.

8. The circuit according to claim 5, wherein said delay unit has a first delay member and a second delay member connected to said signal output terminals of said first and second comparators, respectively, so that said first and second Class-D signals are delayed for a first period of time and a second period of time by said first and second delay members, respectively; and said first and second periods of time are different.

* * * * *